(12) United States Patent
Yudovsky et al.

(10) Patent No.: US 11,094,577 B2
(45) Date of Patent: Aug. 17, 2021

(54) APPARATUS AND METHODS FOR WAFER CHUCKING ON A SUSCEPTOR FOR ALD

(71) Applicant: Applied Materials, Inc., Santa Clara, CA (US)

(72) Inventors: Joseph Yudovsky, Campbell, CA (US); Kaushal Gangakhedkar, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 448 days.

(21) Appl. No.: 15/927,066

(22) Filed: Mar. 20, 2018

(65) Prior Publication Data

US 2018/0211863 A1 Jul. 26, 2018

Related U.S. Application Data

(63) Continuation of application No. 14/773,005, filed as application No. PCT/US2014/028502 on Mar. 14, 2014, now Pat. No. 9,922,860.

(60) Provisional application No. 61/783,418, filed on Mar. 14, 2013.

(51) Int. Cl.
| | |
|---|---|
| *H01L 21/683* | (2006.01) |
| *C23C 16/455* | (2006.01) |
| *C23C 16/458* | (2006.01) |
| *C23C 16/46* | (2006.01) |
| *C23C 16/50* | (2006.01) |
| *H01L 21/687* | (2006.01) |

(52) U.S. Cl.
CPC ........ *H01L 21/6838* (2013.01); *C23C 16/458* (2013.01); *C23C 16/45544* (2013.01); *C23C 16/46* (2013.01); *C23C 16/50* (2013.01); *H01L 21/68735* (2013.01)

(58) Field of Classification Search
CPC ...... C23C 16/44; C23C 16/455; C23C 16/458
See application file for complete search history.

(56) References Cited

U.S. PATENT DOCUMENTS

| | | | |
|---|---|---|---|
| 5,186,718 A | 2/1993 | Tepman et al. | |
| 5,748,435 A * | 5/1998 | Parkhe | G03F 7/707 361/234 |
| 6,248,398 B1 * | 6/2001 | Talieh | G03F 7/162 427/240 |
| 7,601,224 B2 * | 10/2009 | Foree | C23C 16/45521 118/724 |
| 9,922,860 B2 * | 3/2018 | Yudovsky | H01L 21/6838 |

(Continued)

FOREIGN PATENT DOCUMENTS

| | | |
|---|---|---|
| JP | 03-242919 A | 10/1991 |
| JP | 11-274280 A | 10/1999 |
| KR | 10-2011-0074034 A | 6/2011 |

OTHER PUBLICATIONS

PCT International Preliminary Report on Patentability in PCT/US2014/028502 dated Sep. 24, 2015, 11 pages.

*Primary Examiner* — Kelly M Gambetta
(74) *Attorney, Agent, or Firm* — Servilla Whitney LLC

(57) ABSTRACT

Described are apparatus and methods for processing a semiconductor wafer so that the wafer remains in place during processing. The wafer is subjected to a pressure differential between the top surface and bottom surface so that sufficient force prevents the wafer from moving during processing, the pressure differential generated by applying a decreased pressure to the back side of the wafer.

11 Claims, 5 Drawing Sheets

(56) References Cited

U.S. PATENT DOCUMENTS

2003/0073310 A1 4/2003 Olgado et al.
2011/0030615 A1* 2/2011 Griffin .............. C23C 16/45572
                                                    118/666

* cited by examiner

APPARATUS AND METHODS FOR WAFER CHUCKING ON A SUSCEPTOR FOR ALD

CROSS-REFERENCE TO RELATED APPLICATIONS

This application is a continuation of U.S. patent application Ser. No. 14/773,005, filed Sep. 4, 2015, which is a national phase entry of PCT/US14/28502, filed on Mar. 14, 2014 which claims priority to U.S. Provisional Application No. 61/783,418, filed Mar. 14, 2013, the entire disclosures of which is hereby incorporated herein by reference.

BACKGROUND

Embodiments of the invention generally relate to apparatus and methods of holding a substrate during processing. In particular, embodiments of the invention are directed to apparatus and methods using differential pressure to hold substrates on a susceptor under large acceleration forces.

In some CVD and ALD processing chambers, the substrates, also referred to herein as wafers, move relative to the precursor injector and heater assembly. If the motion creates acceleration forces larger than that of the frictional force, the wafer can become displaced causing damage or related issues. The wafers placed off-axis can slip at high acceleration/deceleration on a moving/rotating susceptor. Friction from the weight of the wafer itself is insufficient to hold the wafer on tools where higher throughput is desired.

To prevent the rotation forces from dislodging the wafer during process, additional hardware to clamp or chuck the wafer in place may be needed. The additional hardware can be expensive, difficult to install, difficult to use and/or cause damage to the wafers during use.

Therefore, there is a need in the art for methods and apparatus capable of keeping a wafer in position during processing to prevent accidental damage to the wafer and hardware.

SUMMARY

One or more embodiments of the invention are directed to processing chambers comprising at least one gas distribution assembly, a susceptor assembly and a drive shaft. The susceptor assembly is below the at least one gas distribution assembly and includes a top surface, a bottom surface and at least one recess in the top surface to support a wafer. The drive shaft supports the susceptor assembly and includes a vacuum source in fluid communication with a hollow area within the drive shaft. At least one passage extends diagonally between a bottom surface of the at least one recess and the hollow area in the drive shaft. A vacuum formed in the hollow area of the drive shaft is in fluid communication with the recess in the susceptor assembly through the at least one passage.

In some embodiments, the susceptor is coated with a material comprising silicon carbide. In one or more embodiments, the susceptor assembly further comprises at least one hole extending from one or more of the top surface and bottom surface of the susceptor assembly to the at least one passage. In some embodiments, the susceptor assembly further comprises a plug in the at least one hole to close the hole. In one or more embodiments, there are a plurality of holes spaced a distance apart, the distance being in the range of about 2 to about 4 times a diameter of the holes.

In some embodiments, the recess in the top surface of the susceptor assembly is sized so that a wafer supported in the recess has a top surface substantially coplanar with the top surface of the susceptor assembly.

One or more embodiments further comprise a channel within the recess in fluid communication the passage. In some embodiments, the channel forms a circular path within the recess, the circular path having a diameter less the size of the recess.

In some embodiments, the hollow area is in fluid communication with a vacuum source. One or more embodiments further comprise a valve in fluid communication with the at least one passage, the valve positioned between the recess and the hollow area. Some embodiments further comprise a connector between the valve and a dechucking gas source. One or more embodiments further comprise a dechucking gas plenum in communication with and between the valve and the dechucking gas source.

In some embodiments, the gas distribution assembly comprises a plurality of pie-shaped gas channels. In one or more embodiments, the plurality of pie-shaped gas channels comprise a first reactive gas channel, a second reactive gas channel and at least one purge gas channel.

In some embodiments, when a wafer is positioned within the recess, there is a pressure differential between the top surface of a wafer and the bottom surface of the wafer greater than about 10 torr. In one or more embodiments, when a wafer is positioned in the recess of the susceptor assembly, the differential pressure between the top surface of the wafer and the pressure in the recess equates to a chucking force large enough to hold a 300 mm wafer at a bolt center radius of about 320 mm at a rotational speed of about 200 rpm.

Some embodiments further comprise a heating assembly below the susceptor assembly. In one or more embodiments, the heating assembly comprises a plurality of lamps directing radiant energy toward the bottom surface of the susceptor assembly.

Additional embodiments of the invention are directed to methods of processing a wafer in a processing chamber. A wafer is positioned in a recess in a top surface of a susceptor assembly. The wafer has a top surface and a bottom surface. The recess includes at least one passage extending through the susceptor assembly to a bottom surface of the susceptor assembly. The wafer and susceptor assembly are passed under a gas distribution assembly comprising a plurality of substantially parallel gas channels directing flows of gases toward the top surface of the susceptor assembly. A pressure differential is created between the top surface and bottom surface of the wafer so that the flow of gases directed toward the top surface of the wafer creates a higher pressure than the pressure at the bottom surface of the wafer. The pressure differential is created with a passage connecting the bottom of the recess with a vacuum source.

In some embodiments, the vacuum source comprises a hollow area within a drive shaft of the susceptor assembly. In one or more embodiments, the top surface of the wafer is substantially coplanar with the top surface of the susceptor assembly.

Some embodiments further comprise dechucking the wafer by applying positive pressure to the recess. In one or more embodiments, dechucking the wafer comprises closing a valve positioned within the passage between the recess and the vacuum source. In some embodiments, dechucking the wafer further comprises directing the valve to allow a flow of a gas to pass through the passage to the recess to provide positive pressure on the back side of the wafer.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention are directed to apparatus and methods for creating a differential pressure developed from a unique precursor injector design with a magnitude sufficient to hold wafers in place at high rotation speeds. As used in this specification and the appended claims, the terms "wafer", "substrate" and the like are used interchangeably. In some embodiments, the wafer is a rigid, discrete substrate.

In some spatial ALD chambers, the precursors used for deposition are injected in close proximity to the wafer surface. To develop the desired gas dynamics, the injector channels are independently controlled at a higher pressure than the surrounding chamber. By creating a pressure differential between the front side of the wafer and the back side of the wafer, a positive pressure force adequate to hold the wafer against relativity larger acceleration force can be generated.

Embodiments of the invention are directed to the use of differential pressure to hold substrates (wafers) on a susceptor under large acceleration forces. The large acceleration forces occur as a result of high rotation speeds, which may be experienced in carousel-type processing chambers, from larger batch sizes and processing speeds or higher reciprocating motion for higher wafer throughput.

In some embodiments, the wafers sit in shallow pockets on a susceptor below the injector assemblies. The susceptor can provide heat transfer, improved gas dynamics and act as a carrier vehicle for the substrates.

Embodiments of the invention are directed to susceptors with an angled hole for vacuum from inner diameter of susceptor-bottom up to the wafer pocket. The susceptor can get a vacuum source through the rotation shaft and rotation motor below the shaft. If the susceptor is made of Silicon Carbide Coated (SiC) Graphite, then additional holes which are spaced, for example, every three times hole diameter, are needed from top or bottom of the susceptor for better penetration of the SiC coating. The redundant holes are plugged for vacuum. Graphite plugs can be press-fit before SiC Coating and then the susceptor is SiC coated. In some embodiments, threaded SiC Coated plugs on SiC Coated susceptor and a second SiC coat can be applied for better sealing of graphite with SiC for more corrosive applications.

Figure 1:
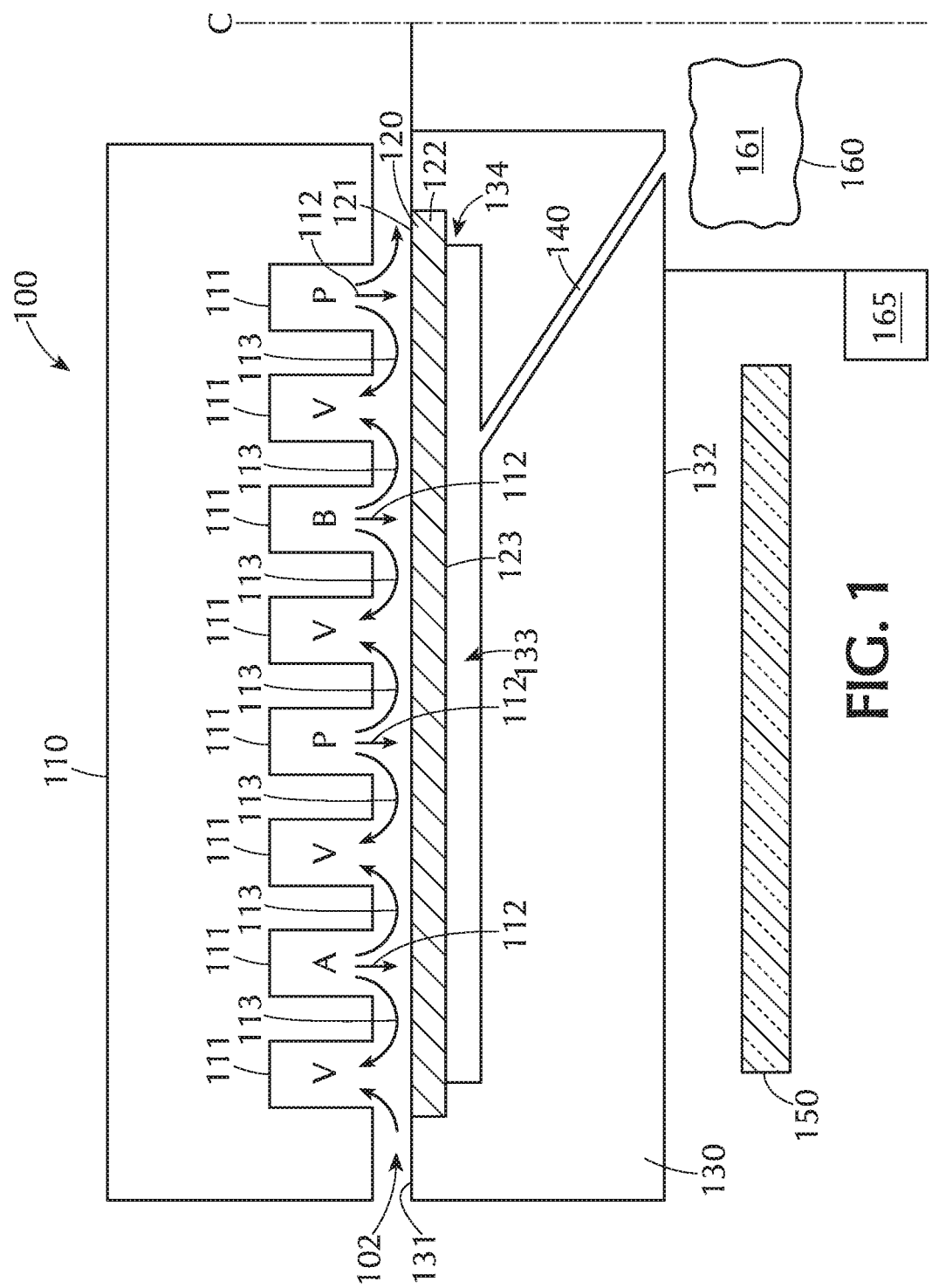
FIG. 1 shows partial cross-sectional view of a processing chamber in accordance with one or more embodiment of the invention.

FIG. 1 shows a portion of a processing chamber 100 in accordance with one or more embodiments of the invention. The processing chamber 100 includes at least one gas distribution assembly 110 to distribute the reactive gases to the chamber. The embodiment shown in FIG. 1 has a single gas distribution assembly 110, but it will be understood by those skilled in the art that there can be any suitable number of gas distribution assemblies. There can be multiple assemblies with spaces between each assembly, or with practically no space between. For example, in some embodiments, there are multiple gas distribution assemblies 110 positioned next to each other so that the wafer 120 effectively sees a consistent repetition of gas streams.

Figure 2:
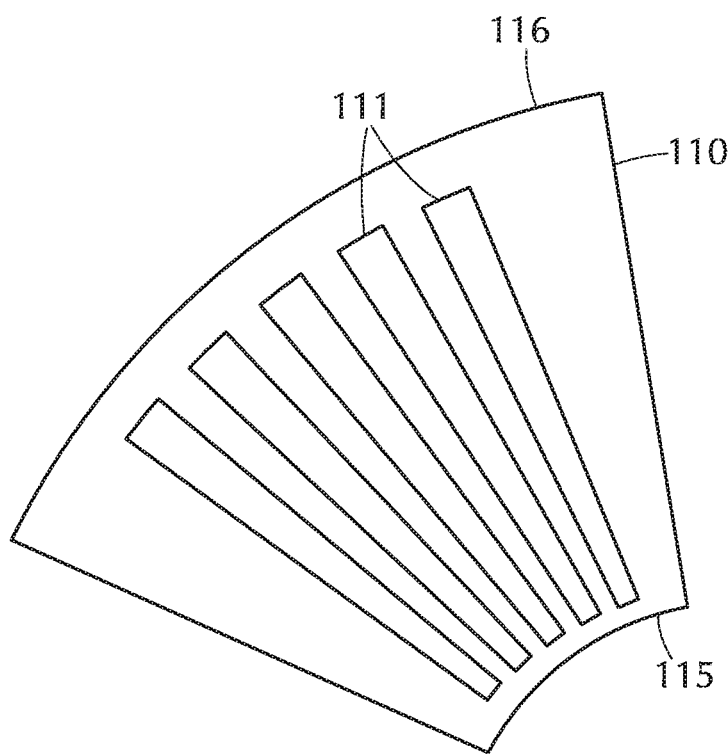
FIG. 2 shows a view of a portion of a gas distribution assembly in accordance with one or more embodiment of the invention.

While various types of gas distribution assemblies 110 can be employed (e.g., showerheads), for ease of description, the embodiment shown in FIG. 1 shows a plurality of substantially parallel gas channels 111. As used in this specification and the appended claims, the term "substantially parallel" means that the elongate axis of the gas channels 111 extend in the same general direction. There can be slight imperfections in the parallelism of the gas channels 111. However, those skilled in the art will understand that a carousel-type processing chamber may rotate the wafers about a central axis offset from the central axis of the wafer. In this configuration, it may be useful to have gas channels 111 that are not substantially parallel. Referring to FIG. 2, the gas distribution assembly 110 may be a pie-shaped segment in which the gas channels 111 extend from in inner edge 115 of the pie-shape toward the outer edge 116 of the pie-shape. The shape of the gas channels 111 can also vary. In some embodiments, the gas channels 111 have a substantially uniform width along the length of the channel extending from the inner edge 115 to the outer edge 116. In other embodiments, the width of the gas channel 111 increases along the length of the channel extending from the inner edge 115 to the outer edge 116. This is shown in FIG. 2, where it can be seen that the gas channels 111 have a smaller width at the inner edge 115 and a wider width at the outer edge 116. The aspect ratio of this change in width, in accordance with some embodiments, may be equal to the radial difference in position so that the edges of each channel extend from the same point. This may result in all point of a wafer passing beneath the gas channels having about equal residence time. Stated differently, each channel with may change as a function of the distance from center of the susceptor rotation.

Referring back to FIG. 1, the plurality of gas channels 111 can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface 121 of the wafer 120. This flow is shown with arrows 112. Some of the gas flow moves horizontally across the surface 121 of the wafer 120, up and out of the processing region through the purge gas P channel(s), shown with arrows 113. A substrate moving from the left to the right will be exposed to each of the process gases in turn, thereby forming a layer on the substrate surface. The substrate can be in a single wafer processing system in which the substrate is moved in a reciprocating motion beneath the gas distribution assembly, or on a carousel-type system in which one or more substrates are rotated about a central axis passing under the gas channels.

A susceptor assembly 130 is positioned beneath the gas distribution assembly 110. The susceptor assembly 130 includes a top surface 131, a bottom surface 132 and at least one recess 133 in the top surface 131. The recess 133 can be any suitable shape and size depending on the shape and size of the wafers 120 being processed. In the embodiment shown the recess 133 has two step regions 134 around the outer peripheral edge of the recess 133. These steps 134 can be sized to support the outer peripheral edge 122 of the wafer 120. The amount of the outer peripheral edge 122 of the wafer 120 that is supported by the steps 134 can vary depending on, for example, the thickness of the wafer and the presence of features already on the back side 123 of the wafer.

In some embodiments, the recess 133 in the top surface 131 of the susceptor assembly 130 is sized so that a wafer 120 supported in the recess 133 has a top surface 121 substantially coplanar with the top surface 131 of the susceptor assembly 130. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The bottom 135 of the recess has at least one passage 140 extending from the bottom of the recess 135 through the susceptor assembly 130 to the drive shaft 160 of the susceptor assembly 130. The passage(s) 140 can be any suitable shape and size and forms a fluid communication between the recess 133 and the drive shaft 160. The drive shaft 160 can be connected to a vacuum source 165 which forms a region of decreased pressure (referred to as a vacuum) within a hollow area 161 of the drive shaft 160. As used in this specification and the appended claims, the term "vacuum" used in this context means a region having a lower pressure than the pressure of the processing chamber. It is not necessary for there to be an absolute vacuum. In some embodiments, the vacuum, or region of decreased pressure has a pressure less than about 50 Torr, or less than about 40 Torr, or less than about 30 Torr, or less than about 20, Torr, or less than about 10 Torr, or less than about 5 Torr, or less than about 1 Torr, or less than about 100 mTorr, or less than about 10 mTorr.

The hollow area 161 can act as a vacuum plenum so that if there is a loss of external vacuum, the vacuum within the hollow area 161 can remain at decreased pressure. The passage 140 is in communication with the hollow area 161 so that the vacuum within the hollow area 161 can draw on the back side 123 of the wafer 120 through the passage 140.

With a vacuum, or partial vacuum, in the recess 133 below the wafer 120, the pressure in the reaction region 102 above the wafer 120 is greater than the pressure in the recess 133. This pressure differential provides sufficient force to prevent the wafer 130 from moving during processing. In one or more embodiments, the pressure in the recess 133 below the wafer 120 is lower than the pressure above the wafer 120 and the pressure in the processing chamber 100.

The pressure applied to the top surface 121 of the wafer 120 from the gas streams emitted by the gas distribution assembly 110, in conjunction with the decreased pressure beneath the wafer, help hold the wafer in place. This may be of particular use in carousel-type processing chambers in which the wafers are offset from and rotated about a central axis. The centrifugal force associated with the rotation of the susceptor assembly can cause the wafer to slide away from the central axis. The pressure differential on the top side of the wafer versus the bottom side of the wafer, due to the gas pressure from the gas distribution assembly versus the pressure applied by the vacuum to the back side of the wafer, helps prevent the movement of the wafer. The gas channels of the gas distribution assembly can be controlled simultaneously (e.g., all of the output channels—reactive gases and purge channels—controlled together), in groups (e.g., all of the first reactive gas channels controlled together) or independently (e.g., the left-most channel controlled separately from the adjacent channel, etc.). As used in this specification and the appended claims, the term "output channels" "gas channels", "gas injectors" and the like are used interchangeably to mean a slot, channel or nozzle type opening through which a gas is injected into the processing chamber. In some embodiments, the first reactive gas channel, the second reactive gas channel and the at least one purge gas channel are independently controlled. Independent control may be useful to provide a positive pressure on the top surface of the wafer positioned in the recess of the susceptor assembly. In some embodiments, each individual first reactive gas injector, second reactive gas injector, purge gas injector and pump channel can be individually and independently controlled.

The pressure differential between the top surface of the wafer and the bottom surface of the wafer can be adjusted by changing, for example, the pressure of the gases from the gas distribution assembly, the flow rate of the gases from the gas distribution assembly, the distance between the gas distribution assembly and the wafer or susceptor surface and the vacuum pressure. As used in this specification and the appended claims, the differential pressure is a measure of the pressure above the wafer vs. the pressure below the wafer. The pressure above the wafer is the pressure applied to the wafer surface or the pressure in the reaction region 102 of the processing chamber 100. The pressure below the wafer is the pressure in the recess, the pressure on the bottom surface of the vacuum pressure in the susceptor assembly 130. The magnitude of the pressure differential can directly affect the degree to which the wafer is chucked. In some embodiments, the pressure differential between the top surface 121 of the wafer 120 and the bottom surface 123 of a wafer 120 is greater than about 15 torr, or greater than about 10 torr, or greater than about 5 torr. In one or more embodiments, the differential pressure between the top surface 121 of the wafer 120 and the pressure in the recess 133 equates to a chucking force large enough to hold a 300 mm wafer at a bolt center radius of about 320 mm at a rotational speed of about 200 rpm.

In some embodiments, as shown in FIG. 1, the processing chamber 100 includes a heating assembly 150. The heating assembly can be positioned in any suitable location within the processing chamber including, but not limited to, below the susceptor assembly 130 and/or on the opposite side of the susceptor assembly 130 than the gas distribution assembly 110. The heating assembly 150 provides sufficient heat to the processing chamber to elevate the temperature of the wafer 120 to temperatures useful in the process. Suitable heating assemblies include, but are not limited to, resistive heaters and radiant heaters (e.g., a plurality of lamps) which direct radiant energy toward the bottom surface of the susceptor assembly 130.

The distance between the gas distribution assembly 110 and the top surface 121 of the wafer 120 can be tuned and may have an impact on the pressure differential and the efficiency of the gas flows from the gas distribution assembly. If the distance is too large, the gas flows could diffuse outward before encountering the surface of the wafer, resulting in a lower pressure differential and less efficient atomic layer deposition reaction. If the distance is too small, the gas flows may not be able to flow across the surface to the vacuum ports of the gas distribution assembly and may result in a large pressure differential. In some embodiments, the gap between the surface of the wafer and the gas distribution assembly is in the range of about 0.5 mm to about 2.0 mm, or in the range of about 0.7 mm to about 1.5 mm, or in the range of about 0.9 mm to about 1.1 mm, or about 1.0 mm.

The recess 133 shown in FIG. 1 supports the wafer 120 about an outer peripheral edge 122 of the wafer 120. Depending on the thickness, stiffness and/or vacuum pressure in the recess 133, this arrangement can result in the successful chucking of the wafer, thereby preventing movement of the wafer during rotation or movement of the susceptor assembly 130. However, if the wafer is not thick or stiff, or the vacuum pressure in the recess 133 is too low, the wafer 120 may deflect so that the center portion of the wafer is further away from the gas distribution assembly 110 than the outer peripheral edge 122 of the wafer 120.

Figure 3:
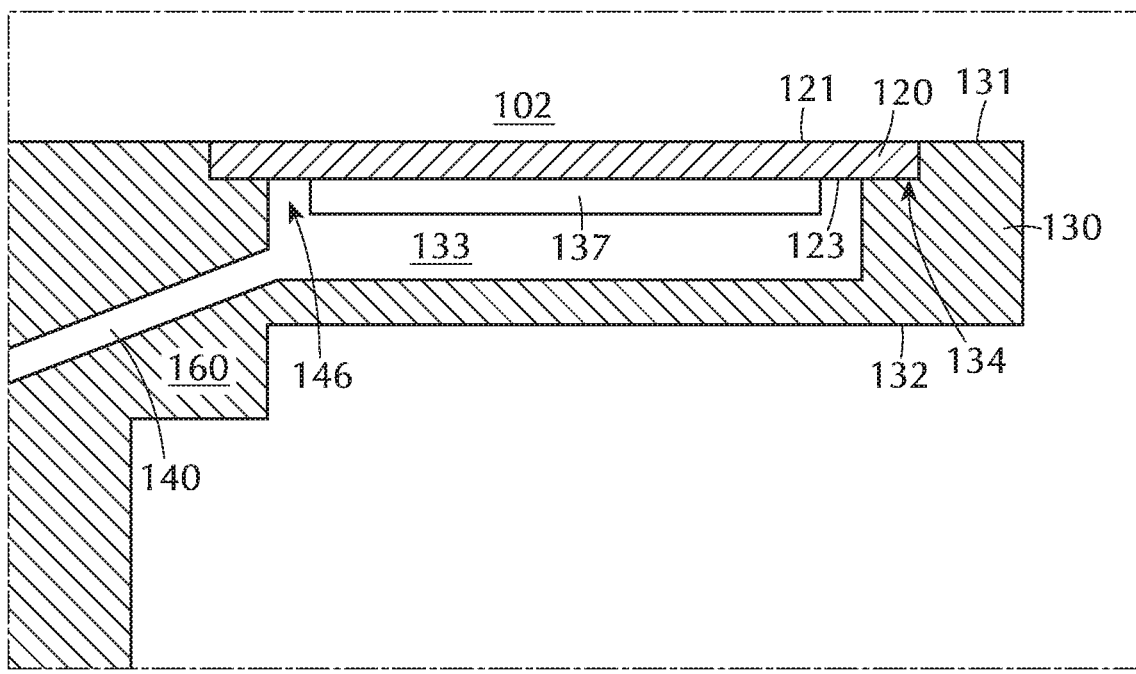
FIG. 3 shows a partial cross-sectional view of a processing chamber in accordance with one or more embodiment of the invention.

FIG. 3 shows another embodiment which helps prevent deflection of the wafer by providing a greater support surface area. Here, the wafer 120 is supported across a majority of the back surface 123 by the susceptor 130. This Figure shows a cross-section of the susceptor assembly. The center portion 137 of the susceptor assembly 130 is not free floating, but is connected to the remainder of the susceptor in a different plane than the cross-sectional view. The passage 140 extends from the drive shaft 160, or from a hollow area 161 within the drive shaft 160 toward the recess 133. The passage 140 connects to a channel 146 which extends toward the top surface 131 of the susceptor assembly 130. The vacuum chucks the wafer 120 to the susceptor assembly 130 by the vacuum through the channel 146 and passage 140.

Figure 4:
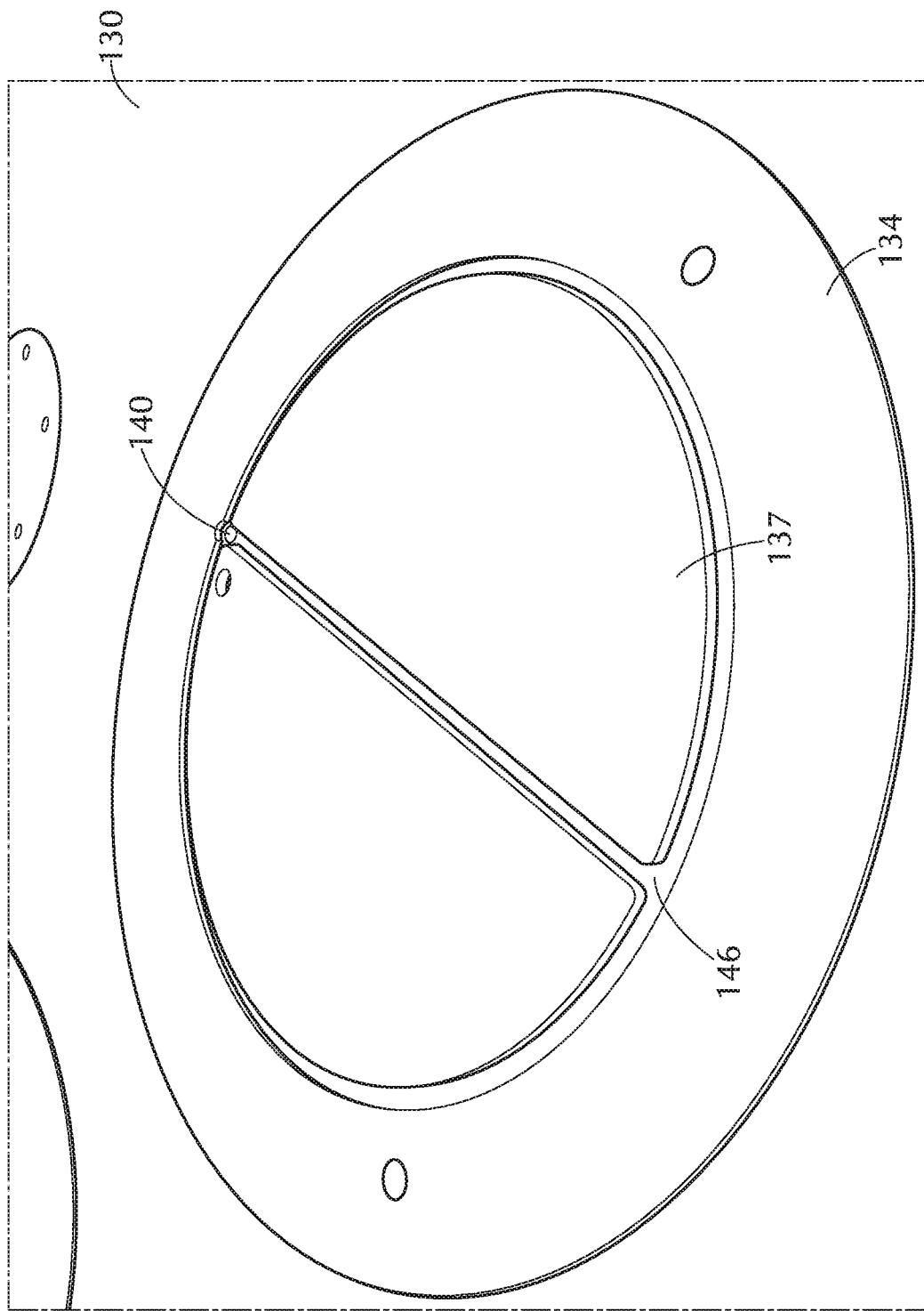
FIG. 4 shows a perspective view of a recess in a susceptor assembly with vacuum passages visible in accordance with one or more embodiment of the invention.

FIG. 4 shows a perspective view of a susceptor assembly 130 similar to that of FIG. 3. The susceptor assembly 130 shown has a recess 133 with a relatively large step 134 to support the outer peripheral edge 122 of the wafer (not shown). The recess 133 includes a large passage 140 connects the channel 146 to the vacuum in the drive shaft. The channel shown is shaped like a capital theta, providing a channel ring with a channel portion extending across the diameter of the ring. The center portion 137 of the susceptor assembly 130 is about coplanar with the step 134 so that the center portion 137 and the step 134 support the wafer at the same time.

Figure 5:
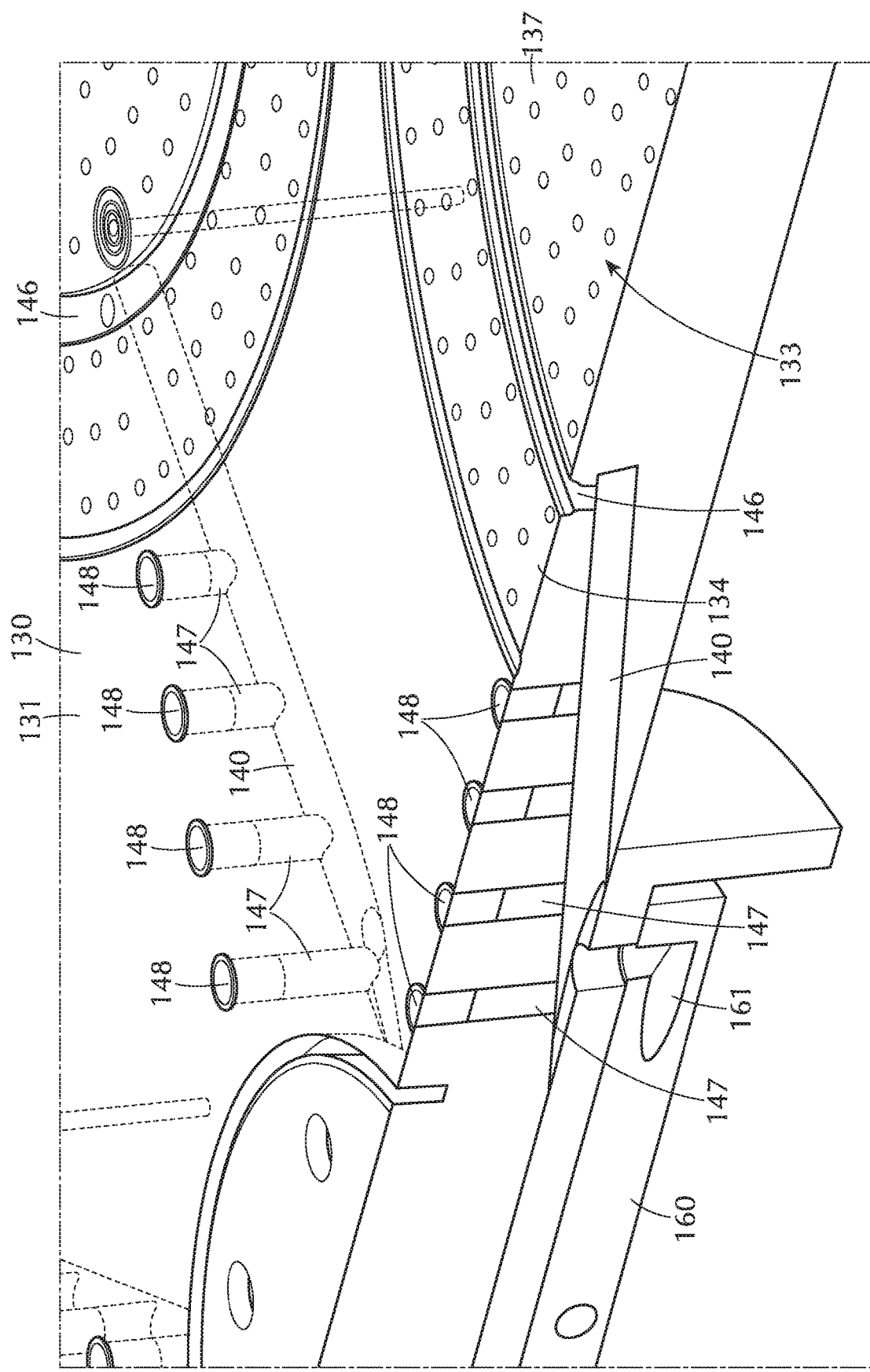
FIG. 5 shows a cross-sectional perspective view of a susceptor assembly in accordance with one or more embodiment of the invention.

FIG. 5 shows a perspective view of a susceptor assembly 130 in accordance with one or more embodiments of the invention. Here the passage 140 extends from drive shaft 160 toward the recess 133 connecting the hollow area 161, which acts as a vacuum plenum, with the channel 146 in the recess. The passage 140 has a plurality of holes 147 connecting the top surface 131 of the susceptor assembly 130 with the passage 140. In some embodiments, there is at least one hole extending from one of the top surface 131 of the susceptor assembly 130 and the bottom surface 132 of the susceptor assembly 130 to the passage 140. These holes 147 can be created (e.g., drilled) during the manufacture of the susceptor assembly to allow the inside of the passage 140 to be coated. For example, in some embodiments, the susceptor assembly 130 has a silicon carbide coating. The susceptor assembly of some embodiments is a silicon carbide coated graphite. The holes 147 allow the silicon carbide to be coated on the passage 140 and are then sealed with plugs 148. The plugs can be made of any suitable material including, but not limited to, silicon carbide, silicon carbide coated graphite, a material with a silicon carbide coating and graphite. After the plugs 148 have been inserted into the holes 147, the susceptor assembly can be coated with silicon carbide again to provide an additional sealing of the holes 147. The plugs 148 can be press-fit (e.g., friction fit), connected to the holes 147 by complementary screw threads or connected by some other mechanical connection (e.g., epoxy).

During the preparation of a silicon carbide coated susceptor assembly 130, the holes 147 provide a useful passageway for the silicon carbide to coat the passage 140. The size and spacing of the holes 147 may have an impact on the efficiency of the coating. The holes 147 can be spaced in increments of the hole diameter. For example, if the holes are 5 mm in diameter, the spacing might be 5×mm, with x being any suitable value. For example, the spacing may be 1, 2, 3, 4, 5, 6, 7, 8, 9 or 10 times the hole diameter. The holes 147 can be positioned at any suitable points along the length of the passage 140, and do not need to be evenly distributed across the passage 140 length. As shown in FIG. 5, the holes 147 are concentrated toward the inner portion of the susceptor assembly 130, where the passage 140 is furthest from the top surface 131 of the susceptor assembly 130.

Figure 6:
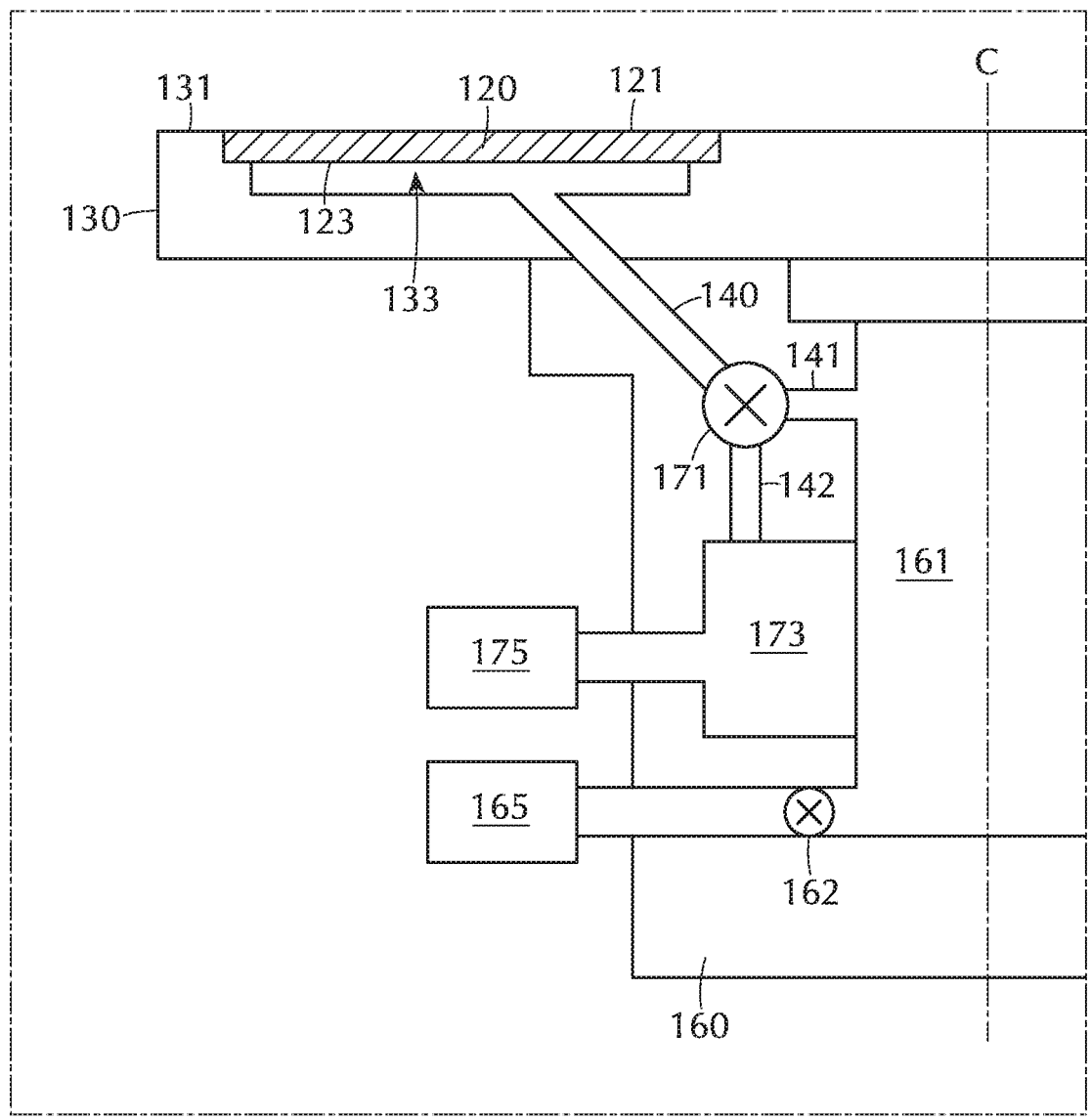
FIG. 6 shows a partial cross-sectional view of a susceptor assembly in accordance with one or more embodiment of the invention.

The passages 140 can be used to supply a vacuum to the recess 133 to chuck the wafer 120. However, when the wafer is processed, the vacuum may be too strong to easily remove the processed wafer from the recess. To ease removal of the wafer, the passages 140 can also be used to provide a flow of gas toward the back side of the wafer 120. Thus providing a positive pressure to the back side of the wafer to allow the wafer to be easily removed from the susceptor assembly. FIG. 6 shows a schematic view of a susceptor assembly in accordance with one or more embodiments of the invention. Here, the recess 133 is connected to the passage 140 which leads to the hollow area 161 within the drive shaft. A valve 171 is positioned within the passage 140. The valve 171 can allow a fluid connection between the passage 140 and the hollow area 161 through connector 141. If a vacuum, or region of decreased pressure, is formed in the hollow area 161, then the valve can connect the hollow area 161 to the recess 133 through the connector 141 and passage 140. The valve 171 can be switched to break the fluid connection between the passage 140 and the hollow area 161. The valve can be set to a closed position, isolating the passage 140, or to a position where a connection is formed between the passage 140 to a dechucking gas plenum 173 through connector 142. The dechucking gas plenum 173 is shown in fluid communication with a dechucking gas source 175. The dechucking gas source 175 can comprise any suitable gas including, but not limited to, nitrogen, argon, helium or an inert gas.

The vacuum source 165 can be connected to the hollow area 161 through valve 162. The valve 162 can be used to isolate the hollow area 161 from the vacuum source 165 in the event that there is a loss of vacuum from the vacuum source 165. This allows the hollow area 161 to act as a vacuum plenum so that the wafers on the susceptor assembly remain chucked until while the vacuum source is being reconnected or repaired.

Each of the individual recesses 133 in the susceptor assembly 130 can include a separate passage 140 and valve 171. This allows each individual recess 133 to be isolated from the vacuum in the hollow area 161. For example, a processed wafer 120 can be rotated to the loading/unloading area of the processing chamber. The valve 171 can be closed or switched to the dechucking gas plenum 173 to cause a positive pressure on the back side of the wafer, allowing a robot to pick up the wafer. After picking up the wafer, the valve can close so that the pressure in the recess 133 will be equal to the pressure of the chamber. A new wafer can be placed in the recess and the valve 171 switched back to allow fluid connection with the hollow area 161 to chuck the new wafer.

Substrates for use with the embodiments of the invention can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor wafer, such as a 200 mm or 300 mm diameter silicon wafer.

As used in this specification and the appended claims, the terms "reactive gas", "reactive precursor", "first precursor", "second precursor" and the like, refer to gases and gaseous species capable of reacting with a substrate surface or a layer on the substrate surface.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A susceptor assembly comprising:
a susceptor having a top surface, a bottom surface and a plurality of recesses in the top surface to support a plurality of wafers, the plurality of recesses positioned so that a central axis of the wafer is offset from a central axis of the susceptor assembly, each of the plurality of recesses having a bottom surface;
a drive shaft at the central axis of and supporting the susceptor assembly, the drive shaft including a hollow area within the drive shaft, the hollow area configured to be connected to a vacuum source; and
at least one passage extending diagonally between the bottom surface of each of the plurality of recesses and the hollow area in the drive shaft and forming fluid communication between the recess and the hollow area.

2. The susceptor assembly of claim 1, wherein the susceptor is coated with a material comprising silicon carbide.

3. The susceptor assembly of claim 1, wherein the susceptor assembly further comprises at least one hole extending from one or more of the top surface and bottom surface of the susceptor to the at least one passage.

4. The susceptor assembly of claim 3, wherein there are a plurality of holes spaced a distance apart, the distance being in the range of about 2 to about 4 times a diameter of the holes.

5. The susceptor assembly of claim 1, wherein each of the plurality of recesses further comprises a channel in fluid communication with the passage.

6. The susceptor assembly of claim 5, wherein the channel forms a circular path within the recess, the circular path having a diameter less the size of the recess.

7. The susceptor assembly of claim 1, wherein the hollow area is in fluid communication with a vacuum source.

8. The susceptor assembly of claim 7, further comprising a valve in fluid communication with the at least one passage, the valve positioned between the recess and the hollow area.

9. The susceptor assembly of claim 8, further comprising a connector between the valve and a dechucking gas source and, optionally, a dechucking gas plenum in communication with and between the valve and the dechucking gas source.

10. The susceptor assembly of claim 1, wherein when a wafer is positioned within the recess, there is a pressure differential between the top surface of a wafer and the bottom surface of the wafer greater than about 10 torr.

11. The susceptor assembly of claim 10, wherein when a wafer is positioned in the recess of the susceptor assembly, the differential pressure between the top surface of the wafer and the pressure in the recess equates to a chucking force large enough to hold a 300 mm wafer at a bolt center radius of about 320 mm at a rotational speed of about 200 rpm.

* * * * *